(12) United States Patent
Tanikella

(10) Patent No.: US 7,335,608 B2
(45) Date of Patent: Feb. 26, 2008

(54) MATERIALS, STRUCTURES AND METHODS FOR MICROELECTRONIC PACKAGING

(75) Inventor: Ravindra V. Tanikella, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 201 days.

(21) Appl. No.: 10/948,386

(22) Filed: Sep. 22, 2004

(65) Prior Publication Data

US 2006/0060956 A1    Mar. 23, 2006

(51) Int. Cl.
*H01L 21/31* (2006.01)
*H01L 21/302* (2006.01)

(52) U.S. Cl. .................. 438/780; 438/82; 438/725

(58) Field of Classification Search ............... 438/82, 438/723, 725, 743, 780
See application file for complete search history.

(56) References Cited

U.S. PATENT DOCUMENTS

| | | | |
|---|---|---|---|
| 4,692,272 A * | 9/1987 | Goswami et al. | 252/514 |
| 5,478,913 A | 12/1995 | Boyce et al. | |
| 6,051,321 A | 4/2000 | Lee et al. | |
| 6,127,509 A | 10/2000 | Pratte et al. | |
| 6,191,483 B1 | 2/2001 | Loo | |
| 6,323,297 B1 | 11/2001 | Lee et al. | |
| 2004/0256731 A1* | 12/2004 | Mao et al. | 257/773 |

OTHER PUBLICATIONS

Kathleen Nargi-Toth, "Manufacturing High-Density Interconnect Structures". HDIS Manufacturing, Circuits Assembly, Feb. 1999, www.cassembly.com. pp. 40-47.

Tom Dory, "Simultaneous Chip-Join and Underfill Assembly Technology for Flip-Chip Packaging". Intel Technology Journal Q3, 2000. pp. 1-7.

Marc Papageorge, "Choosing the Correct Chip Size Package for the Right Application". Marc Papageorge, ASAT Ltd.

David Wiens, Getting Through the Advanced Interconnect Maze. "How Shrinking Vias and Sophisticated Packaging Affect the PCB Design Process". Electronic Packaging & Production, www.epp.com, Apr. 2001.

Anthony A. Primavera, "Chip Scale Package Technology Wafer Scale Package Issues". Universal Instruments Corporation, Jul. 2000.

(Continued)

*Primary Examiner*—Hung Vu
(74) *Attorney, Agent, or Firm*—Blakely, Sokoloff, Taylor & Zafman LLP

(57) ABSTRACT

Highly reliable interconnections for microelectronic packaging. In one embodiment, dielectric layers in a build-up interconnect have a gradation in glass transition temperature; and the later applied dielectric layers are laminated at temperatures lower than the glass transition temperatures of the earlier applied dielectric layers. In one embodiment, the glass transition temperatures of earlier applied dielectric films in a build-up interconnect are increased through a thermosetting process to exceed the temperature for laminating the later applied dielectric films. In one embodiment, a polyimide material is formed with embedded catalysts to promote cross-linking after a film of the polyimide material is laminated (e.g., through photo-chemical or thermal degradation of the encapsulant of the catalysts). In one embodiment, the solder resist opening walls have a wettable layer generated through laser assisted seeding so that there is no gap between the solder resist opening walls and no underfill in the solder resist opening.

16 Claims, 22 Drawing Sheets

OTHER PUBLICATIONS

Sidharth Dalmia, "High-Q RF Passives on Organic Substrates Using a Low-Cost, Low-Temperature Laminate Process". School of Electrical & Computer Engineering, Packaging Research Center.

"Printed Wiring Board Pollution Prevention and Control Technology: Analysis of Updated Survey Results". EPA's Design for the Environment Branch. pp. 1-64.

Erik Swensen, "CTE Mismatch Summary Report of the Current Baseline Design". HYTEC Inc., Jun. 2000. pp. 1-12.

A. Ostmann, "Chip In Polymer—Next Step in Miniaturization". iMAPS.com. Advancing Microelectronics, vol. 29, No. 3, May/Jun. 2002.

Scott Corbett, "Advanced Multilayer Polyimide Substrate Utilizing UV Laser Microvia Technology". Presented at IMAPS 2000, Sep. 2000.

Ravi Mahajan, "The Evolution of Microprocessor Packaging". Intel Technology Journal Q3, 2000. pp. 1-10.

Yasuhiro Yoneda, "A Highly Reliable Halogen-Free Dielectric for Build-up Printed Circuit Boards". Jan. 2002.

Tadanori Shimoto, "High-Performance FCBGA Based on Multi-Layer Thin-Substrate Packaging Technology". NEC Research & Development, vol. 44, No. 3, Jul. 2003. pp. 213-218.

Bernd Appelt, "Multiple Layers of Microvias for Organic Chip Carriers", Technical Paper Presented at IPC Circuits Expo Apr. 1998. pp. S14-3 to S14-3-5.

E.D. Perfecto, "Thin-film Multichip Module Packages for High-end IBM Servers", IBM Journal of Research and Development, vol. 42, No. 5, 1998.

* cited by examiner

MATERIALS, STRUCTURES AND METHODS FOR MICROELECTRONIC PACKAGING

FIELD

At least some embodiments of the invention relate to microelectronic packaging, and more specifically, to packaging techniques involving build-up interconnects.

BACKGROUND

The circuitry of an integrated circuit (IC) chip (e.g., a microprocessor, a random access memory, a microcontroller, an application specific integrated circuit, and others) is typically connected to another circuitry through interconnect structures, such as interposer, substrate, and board. An interposer provides electrical interconnections between an IC and its package; a substrate typically provides connection between an IC chip and a board; a board typically provides connections between various components. To make the electronic equipments smaller, faster, lighter and less expensive, high-density interconnect structures are fabricated to accommodate a large number of wires per unit area in substrates or boards. For example, using a sequential build up approach, a printed circuit board (or printed wiring board) can be fabricated through adding layers of circuitry over layers of dielectrics and through selectively removing the dielectrics to form microvia connections and plated through hole connections among layers of circuitry that are separated by the dielectrics. In a high-density interconnect structure, wires in a package can be routed through multiple layers of traces and through the microvias between the layers of traces. Traditional laminates, such as flame retardant woven glass reinforced epoxy resin or bismaleimide-triazine epoxy resin, have been used for chip-scale packages designed with various mother board interfacing styles, such as pin-grid array (PGA), ball-grid array (BGA) and land grid array (LGA).

Multichip Module (MCM) is a packaging approach based on the interconnection of multiple bare die on a single substrate. Polyimides have been used as dielectrics in MCM types of structures, in which polyimides are spin coated to form the dielectric layers. Sodium or potassium hydroxide (NaOH/KOH) treatment of polyimide has been used to promote copper adhesion to polyimide.

Conductive traces are typically formed through a metallization process. In a subtractive metallization process, a blanket layer of metal is formed on the substrate; and a photoresist and metal etch process is used to remove a portion of the blanket layer to define the traces. In a fully-additive metallization process, metal traces are directly formed on the substrate. In a semi-additive metallization process, a blanket seed layer of metal is formed on the substrate; after the traces of a desired thickness are formed using a photoresist and plating process, the seed layer outside the traces is removed. A metallization process can be performed through either electroless plating or electrolytic plating. Electroless plating uses metal deposition from solution by chemical activation of the surface. Electrolytic plating uses current-induced metal deposition through an electrolyte.

The holes for microvias can be obtained through drilling the dielectric layer. The high temperature generated during drilling can cause the melting and smearing of the epoxy-resin base material over the conductive contacts in the hole. The smear may cause a defective circuit. Desmear is a process to remove the resin smear and clean the hole. Typically, a sodium or potassium permanganate solution is used to desmear. The permanganate desmear may include epoxy sensitizing, permanganate etch, and neutralizing. The sensitizer swells the epoxy and facilitates the subsequent removal. The permanganate solution etches the epoxy by oxidizing the covalent bonds within the polymer network. The neutralizing bath removes permanganate from the oxidized hole and panel surface.

BRIEF DESCRIPTION OF THE DRAWINGS

The accompanying drawings illustrate by way of example and not limitation, in which like references indicate similar elements.

DETAILED DESCRIPTION

In the following description, numerous specific details are set forth. However, it is understood that embodiments of the invention may be practiced without these specific details. In other instances, well-known circuits, structures and techniques have not been shown in detail in order to avoid obscuring the understanding of the disclosure. References to one or an embodiment in the present disclosure are not necessarily references to the same embodiment; and, such references mean at least one.

At least some embodiments of the present invention provide highly reliable interconnections for microelectronic packaging. In one embodiment, dielectric layers in a build-up interconnect have a gradation in glass transition temperature; and the later applied dielectric layers are laminated at temperatures lower than the glass transition temperatures of the earlier applied dielectric layers. In one embodiment, the glass transition temperatures of earlier applied dielectric films in a build-up interconnect are increased through a thermosetting process to exceed the temperature for laminating the later applied dielectric films. In one embodiment, a polyimide material is formed with embedded catalysts to promote cross-linking after a film of the polyimide material is laminated (e.g., through photo-chemical or thermal degradation of the encapsulant of the catalysts). In one embodiment, the solder resist opening walls have a wettable layer generated through laser assisted seeding so that there is no gap between the solder resist opening walls and there is no underfill in the solder resist opening.

Figure 1:
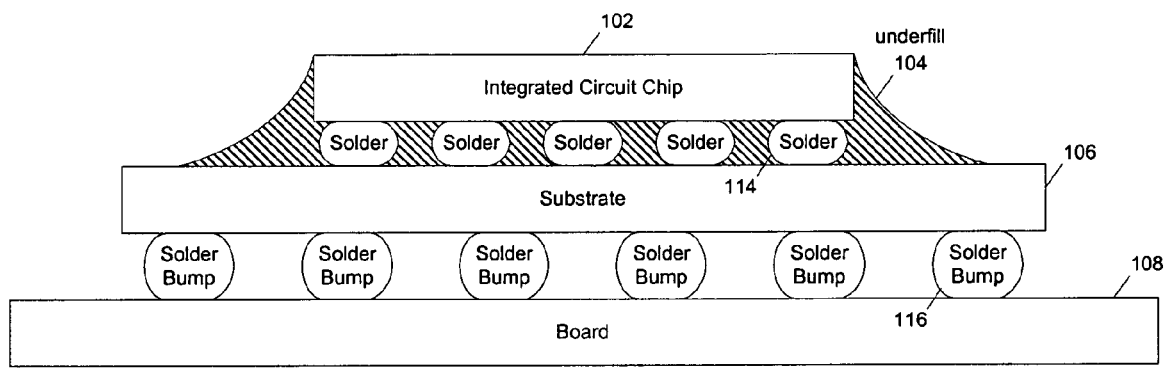
FIG. 1 illustrates a microelectronic device which uses interconnects according to embodiments of the present invention.

FIG. 1 illustrates a microelectronic device which uses interconnects according to embodiments of the present invention. In FIG. 1, an integrated circuit chip (102) is packaged on a substrate (106). The substrate (106) can contain a build-up interconnect according to embodiments of the present invention. In one embodiment of the present invention, a build-up interconnect is fabricated though the lamination of a dielectric film at a temperature lower than the glass transition temperature of the underlying dielectric films to prevent pattern shifting and to provide a highly reliable interconnect. Solder (114) electronically connects the circuit in the integrated circuit chip (102) to the interconnect in the substrate (106). The integrated circuit chip (102) packaged on the substrate (106) is mounted on a board (108) through solder bumps (e.g., 116). The board (108) can also contain a build-up interconnect according to embodiments of the present invention. A build-up interconnect according to embodiments of the present invention can also be used for an interposer. The underfill (e.g., 104) fills between the integrated circuit chip (e.g., 102) and the substrate (e.g., 106) to provide mechanical support and to protect the solder connection between the integrated circuit chip and its substrate. In one embodiment of the present invention, the solder resist opening walls have a wettable layer formed to prevent the underfill (e.g., in a flow-type of underfill process or a no-flow-type underfill process) from entering the solder resist openings and to prevent cracking and delamination.

A build-up interconnect structure can be fabricated through the lamination of dielectric films. The high temperature lamination of toughened dielectrics under high pressure over an underlying thermoplastic dielectric film can result in a shift of patterns (e.g., the interconnect traces). Exposure of the underlying thermoplastic film to a temperature above its glass transition temperature ($T_g$) for a period of time can cause the shift. Such a pattern shift can result in performance and reliability issues. To avoid the pattern shifting, one embodiment of the present invention uses a toughened thermosetting resin with a high glass transition temperature as the dielectric material and/or uses a thermoplastic film with a lower glass transition temperature (and lamination temperature) than the glass transition temperature of the underlying layer. Such a structure can be repeated over multiple build-up layers.

In one embodiment of the present invention, a multilevel structure (e.g., a substrate) includes a core (e.g., metal, organic or ceramic) with a low Coefficient of Thermal Expansion (CTE) (e.g., less than 10 ppm/K to match the CTEs of semiconductors which are in the range of about 3-7 ppm/K) and thermoplastic or thermosetting polyimide build up layers. When the thermoplastic films are used, the gradation of the glass transition temperatures of the films in the build-up structure is such that an underlying layer that is applied earlier has a higher glass transition temperature than the one above which is applied later. This structure can be extended over multiple layers. In one embodiment, after the core level dielectric material is laminated onto the low-CTE core, a conventional semi-additive process is used to form the first level and the subsequent levels, interconnected by plated through holes (PTH) and microvias. Instead of liquid coating, a lamination process is used to form the subsequent build-up dielectrics. In one embodiment of the present invention, toughened build-up dielectrics such as polyimides are used for low-CTE core based substrates to provide a reliable package for ultra low-k (e.g., with a dielectric constant k smaller than 2) Interlayer Dielectric (ILD) devices.

One embodiment of the present invention uses thermosetting polyimide films. Such a film can be laminated at a temperature that is smaller than the glass transition temperature of the cured film. After the lamination of a thermosetting polyimide film, the film is cured to increase the glass transition temperature so that a subsequent film can be laminated on it at a temperature smaller than its glass transition temperature. This lamination and curing processing can be repeated for multiple levels to avoid pattern shifting.

It is understood that a combination of thermosetting polyimide films and thermoplastic polyimide films can also be used.

Cracking issue of ultra low-k (e.g., with a dielectric constant k<2) Interlayer Dielectric (ILD) is typically solved using low-CTE ceramic substrate. However, ceramic substrates have several problems, including: inability to meet electrical requirements, need for higher layer counts to meet wiring density requirements which adds to the total cost and large form factor. One embodiment of the present invention provides a reliable multi-level build-up structure for advanced high density interconnect substrates for ultra low-k semiconductors.

Figure 2:
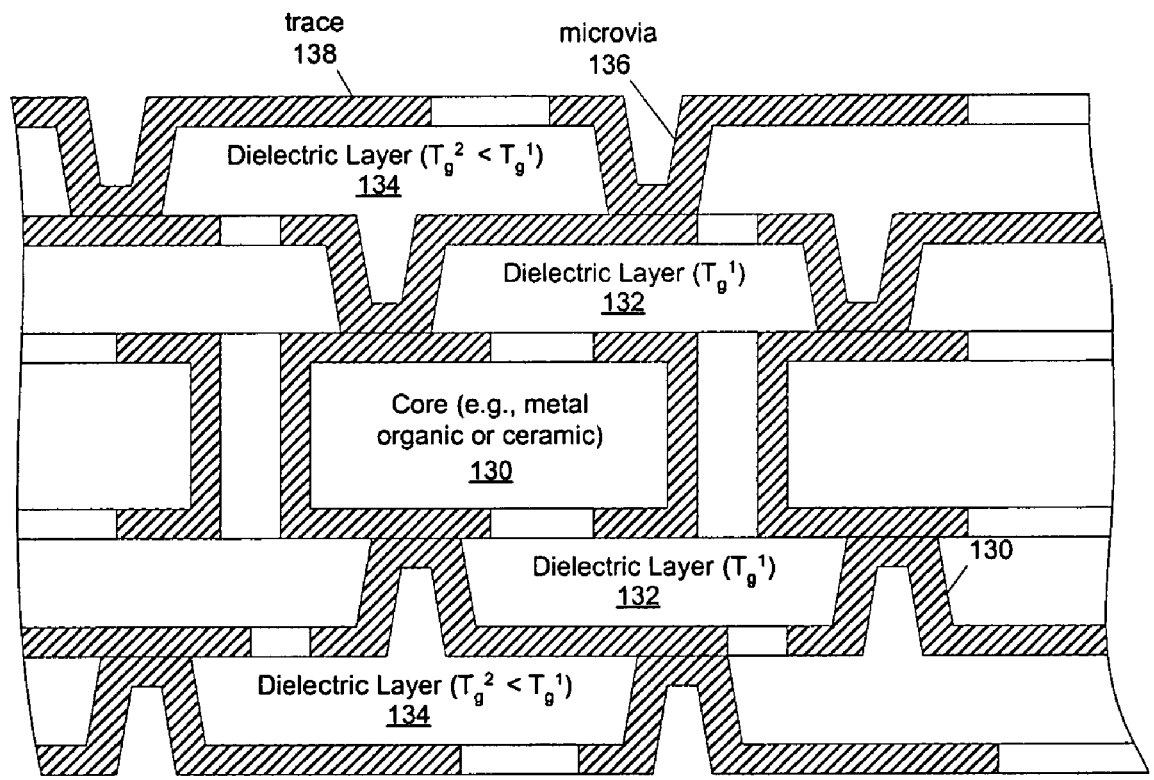
FIG. 2 illustrates a portion of a build-up interconnect according to one embodiment of the present invention.

FIG. 2 illustrates a portion of a build-up interconnect according to one embodiment of the present invention. In FIG. 2, the build-up interconnect has a core (130), dielectric layers (e.g., 132 and 134), conductive traces (e.g., 138), and microvias (e.g., 136) for connecting conductive traces at different levels separated by the dielectric layers (e.g., 134). The core can be metal, organic or ceramic. The core can have plated through holes and traces. The core can be a build-up structure with layers of different materials. In one embodiment, the core has a low Coefficient of Thermal Expansion (CTE) (e.g., in the range of 3-10 ppm/K) and a low dielectric constant (e.g., k<3.9) or an ultra-low dielectric constant (e.g., k<2). The low CTE core reduces (or eliminates) the thermal stress between the substrate and the semiconductors. In one embodiment of the present invention, the earlier applied dielectric layers (e.g., 132) have a glass transition temperature (e.g., $T_g^1$) higher than the glass transition temperature (e.g., $T_g^2$) of the later applied dielectric layers (e.g., 134). Thus, the later applied dielectric layers (e.g., 134) can be laminated at a temperature lower than the glass transition temperature of the earlier applied dielectric layers. If the later applied dielectric layers were laminated at a temperate exceeding the glass transition temperature of the earlier applied dielectric layers, the conductive traces formed on the earlier applied dielectric layers might shift during the lamination process, which can reduce the reliability of the interconnect. Thermosetting or thermoplastic dielectric films can be applied through lamination according to embodiments of the present invention to form build-up interconnect structures. In some embodiments of the present invention, at least at the time when the later applied dielectric layer is being laminated, the glass transition temperatures of the earlier applied dielectric layers are higher than the glass transition temperature of the later applied dielectric layer so that the later applied dielectric layer is applied through lamination at a temperature lower than the glass transition temperatures of the earlier applied dielectric layers. The differences in the glass transition temperatures are sufficient to allow a later applied dielectric layer to be laminated at a temperature for a lamination process and to prevent the pattern shifting in the earlier applied dielectric layer due to the exposure to the temperature for the lamination process.

In one embodiment of the present invention, a layered glass transition temperature ($T_g$) structure provides a reliable package for semiconductor devices with ultra low-k ILD, which satisfies all the mechanical and electrical substrate or package requirements for high and low performance semiconductor devices. One embodiment of the present invention provides a methodology to manufacture highly reliable multi-layer build-up structure, a scaleable multi-layering technology for substrate, board or interposer applications, a substrate package technology which can be manufactured using existing supplier high volume manufacturing (HVM) infrastructure, a low cost alternative to liquid coating techniques (e.g. spin coating) for HVM, and a low cost alternative to vacuum based surface pre-treatment and metallization techniques for improved copper adhesion to polyimide.

Figure 3:
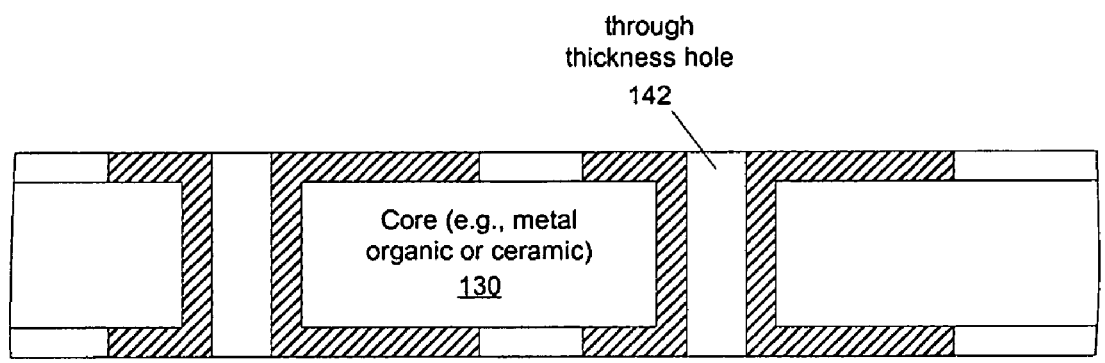
FIGS. 3-7 illustrate a process to form a build-up interconnect according to one embodiment of the present invention.

In one embodiment of the present invention, different thermoplastic dielectric films (e.g., polyimide films) are used for the build-up interconnect. The dielectric films have a low CTE and an ultra-low dielectric constant. FIG. 3-7 illustrate a process to form a build-up interconnect according to one embodiment of the present invention. FIG. 3 shows a core (130) with plated through holes (e.g., 142). The through thickness holes are typically plated with a metal (e.g., copper) to provide electronic connections from one side of the core to the other side of the core. The core can be mainly metal, organic or ceramic or a build-up structure. For example, the core may include a dielectric layer and a metal layer with contacts and traces connected to the plated through holes. The core may be of a substantially uniform substrate material (e.g., metal, organic or ceramic) or of a number of layered materials.

Figure 4:
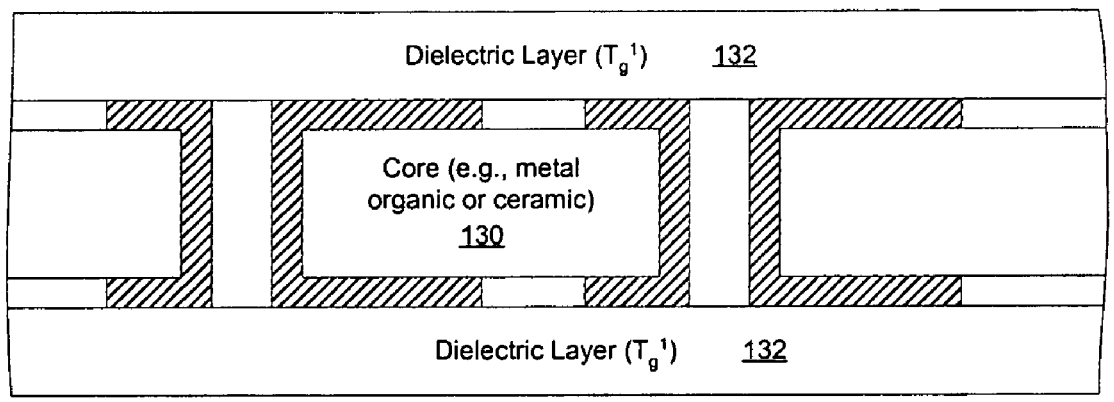

FIG. 4 illustrates the lamination of a dielectric layer (e.g., 132) on the both surfaces of the core. In one embodiment of the present invention, a thin polyimide film (e.g., 20 to 80 micron thick) is laminated using a typical lamination facility for high volume manufacturing (HVM). Polyimides have higher toughness than the typical epoxy resin films used to form a traditional build-up interconnect structure. Thus, using polyimides for the dielectric layers can increase the reliability of the build-up interconnect structure. Some commercially available polyimides can be used, for example, the polyimide laminate films from DuPont and the low-temperature curing polyimides from PI R&D Corporation Limited. The lamination of the film is performed at a temperature higher than the glass transition temperature (e.g., $T_g^1$) of the film (but lower than the glass transition temperatures of any underlying films if any) and under a pressure.

Figure 5:
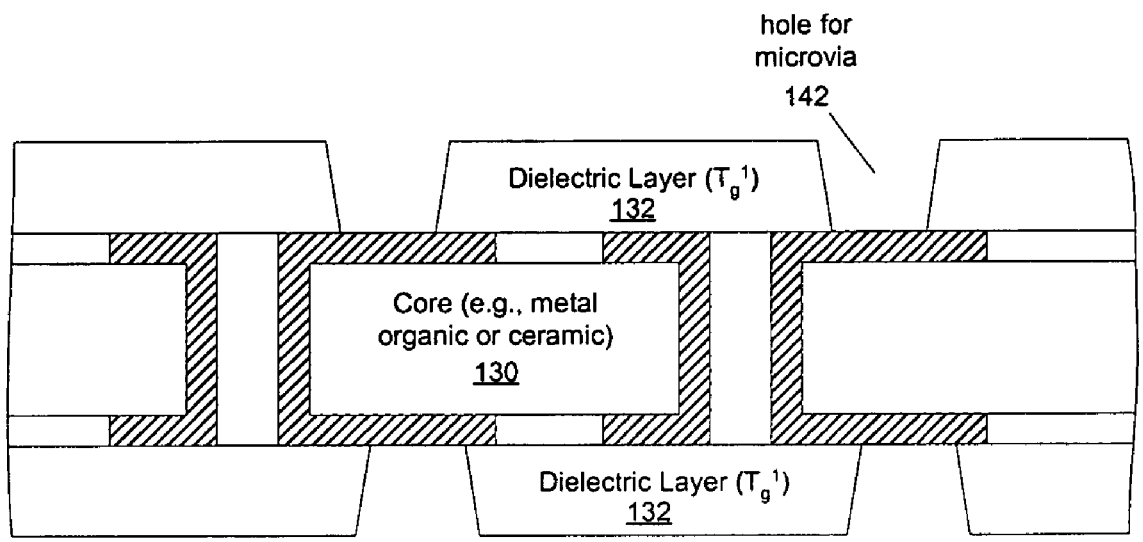

FIG. 5 illustrates the holes for microvias. The holes in the dielectric layer (e.g., 132) can be mechanically or laser drilled. The high temperature generated during the drilling of the holes can melt and smear the dielectric material over the conductive contact in the hole. To clean the hole, a swell-etch desmear process can be used. For example, after swelling the laminated dielectric film using an organic acid (e.g., alkoxy-ethanol or other alkaline based swellers), a permanganate solution ($NaMnO_4$, $KMnO_4$) is used to etch off the dielectric material smear in the hole. The top surface of the dielectric film can be etched using a permanganate solution to roughen the surface of the dielectric film and increase the adhesion. Wet chemical treatment using a permanganate solution (e.g., Sodium Hydroxide (NaOH), Potassium Hydroxide (KOH) and Alkali permanganate solutions) can increase the adhesion of electroless copper to polyimide. A neutralizing bath can be used to chemically neutralize and remove the residue left on the structure from the etching and surface treatment process. For example, $CeSO_4$ can be used as a PH neutral oxidizing liquid; and a sulfuric acid based chemistry may be used to neutralize alkaline treatments.

Figure 6:
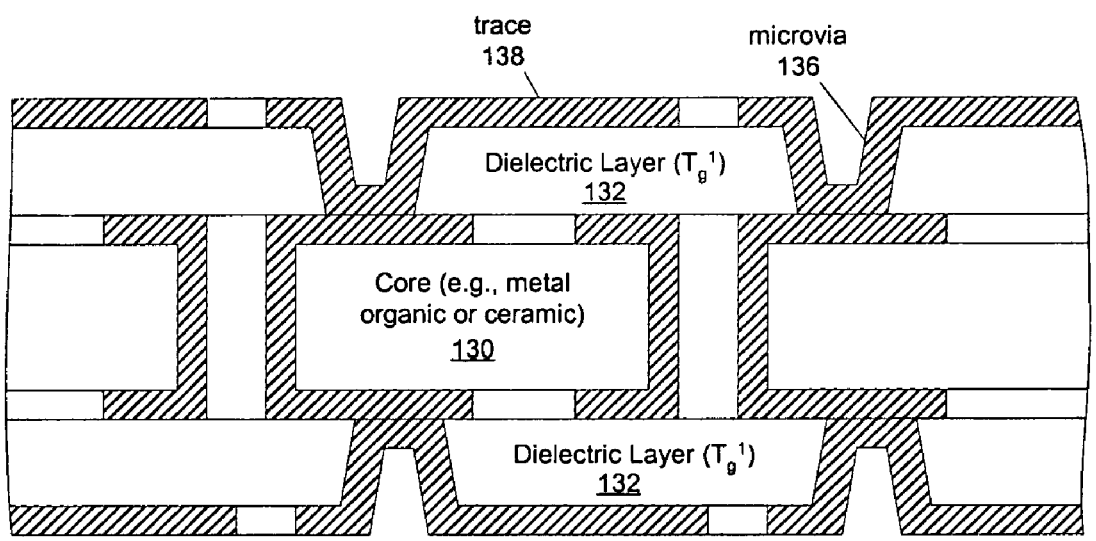

FIG. 6 illustrates the forming of the conductive traces (e.g., 138) and the microvias (e.g., 136). In one embodiment of the present invention, a semi-additive process of copper plating is used to form the conductive traces and the microvias. After a blanket seed layer is deposited using electroless copper plating (or a sputter), a photoresist pattern is formed over the seed layer. Then, electrolytic copper plating is used to form the conductive traces and microvias of a desired thickness over a portion of the seed layer not covered by the photoresist pattern. After the photoresist pattern is stripped off, the portion of the seed layer previously covered under the photoresist pattern is etching off, leaving the traces (e.g., 138) and microvias (e.g., 136) on the dielectric layer. It is understood that other metallization processes (e.g., a fully-additive process or a subtractive process) can also be used.

Figure 7:
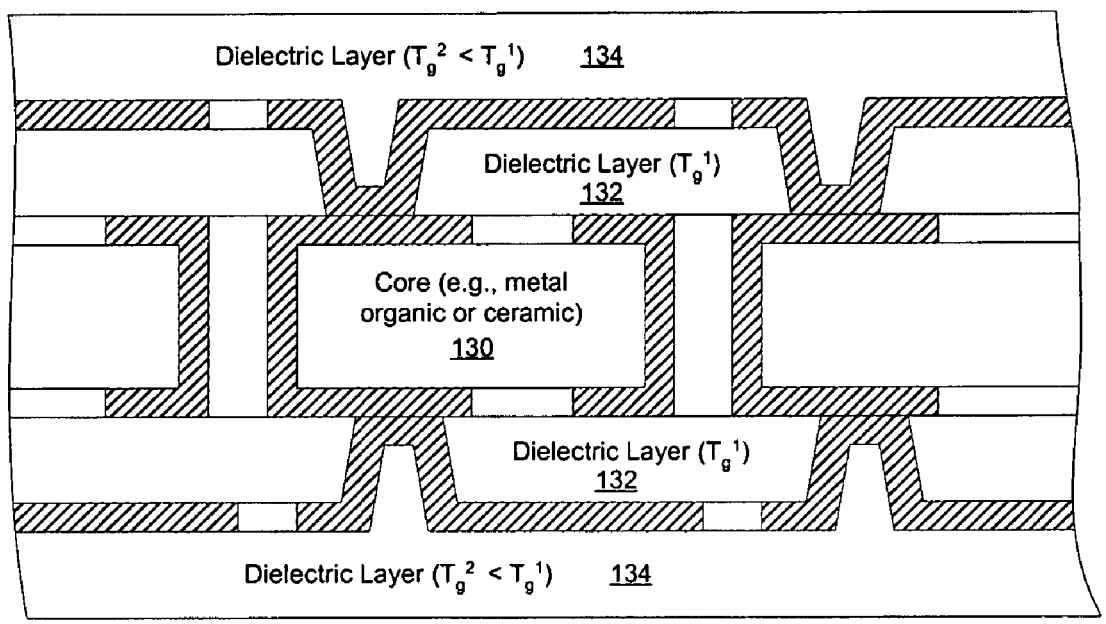

FIG. 7 illustrates the lamination of a new dielectric layer (e.g., 134) on the existing dielectric layer (e.g., 132). The films for the new dielectric layer (e.g., 134) are selected to have a glass transition temperature (e.g., $T_g^2$) lower than the glass transition temperature (e.g., $T_g^1$) of the existing dielectric layer (e.g., 132). Thus, the lamination of the new dielectric layer (e.g., 134) can be performed at a temperature lower than the glass transition temperature (e.g., $T_g^1$) of the existing dielectric layer (e.g., 132). Thus, the lamination process of the new dielectric layer does not cause a pattern shift in the existing dielectric layer.

The process as illustrated in FIGS. 5-7 can be repeated to form multiple levels of interconnect. For example, the dielectric layer (134) can be drilled to form holes for microvias; the swelling and etching operations can be used to desmear the holes in the dielectric layer (134); wet chemical treatment can be applied to improve the adhesion to conductive traces and microvias; a level of conductive traces and microvias can then be formed on the dielectric layer (134) through electroless copper plating (or seeding using a sputter) followed by electrolytic copper plating; then, another dielectric film with a glass transition temperature smaller than that of the dielectric layer (134) can be laminated on top of the dielectric layer (134) under a temperature smaller than the glass transition temperatures of the underlying dielectric layer (134 and 132). The thermoplastic dielectric films are chosen such that there is a gradation of glass transition temperature in the dielectric layers, decreasing from the earlier laminated layers to the later laminated layers. Thus, no pattern shift is produced during the lamination of dielectric films to form the build-up structure.

Although the example of FIGS. 3-7 shows an example of laminating on both side of the core, it is understood that the interconnect structure is not necessarily symmetric in layers of materials on both sides of the core. For example, the structure may have more levels of interconnect on one side than the other side. Further, it is not necessary to apply the dielectric layers on both side at the same time. For example, one can a laminate dielectric film and form a metal layer on one side before starting to laminate on the other side. To protect the existing layers from pattern shifting, one can use a dielectric film that has a lower glass transition temperature than the existing layers so that the lamination of the dielectric film is performed at a temperature lower than the glass transition temperatures of the existing layers. Further, some interconnect structure may not require a thick core. For example, a metal plate may be used as a temporary support to form an ultra-thin interconnect structure. It is understood that the method of present invention can be used in various forms of build-up interconnect structure to avoid pattern shifting in underlying layers during the lamination of the dielectric layers. The build-up interconnect structure can be used in an interposer, a substrate, a board for in chip-scale packaging (CSP), in multichip module (MCM), in chip-in polymer (CIP), or in other packaging approaches.

FIGS. 3-7 illustrate the lamination of thermoplastic films to form the build-up interconnect structure. Alternatively, in one embodiment of the present invention, thermosetting polyimide films are used. The thermosetting polyimide films are such that the films can be laminated at a lower temperature (e.g., $T_1$) before curing and the film has a higher glass transition temperature (e.g., $T_2 > T_1$) after curing. Thus, before a new film is laminated at the lower temperature (e.g., $T_1$), the earlier applied films are cured (e.g., at temperature $T_3 > T_1$) so that the earlier applied films have the higher glass transition temperature (e.g., $T_2$). When the new film is laminated at the lower temperature (e.g., $T_1$), no pattern shift is produced in the earlier applied films. Such a process can be repeated for multiple levels. When such thermosetting polyimide films are used, the same film material can be used for different dielectric layers. After the films are all cured, the glass transition temperatures of the dielectric layers are substantially the same (e.g., $T_2$).

Figure 8:
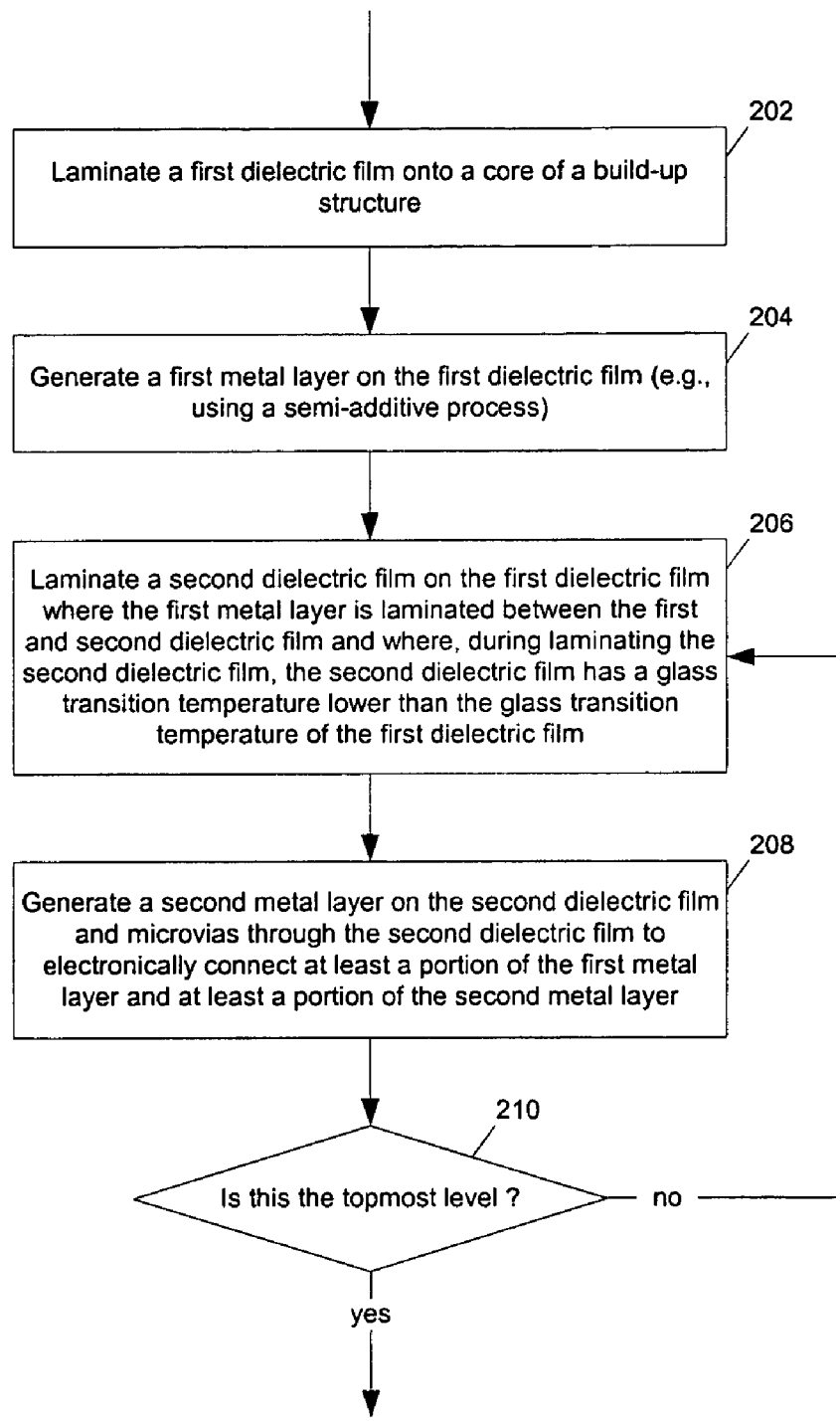
FIG. 8 illustrates a flow diagram of a method to form a build-up interconnect according to one embodiment of the present invention.

FIG. 8 illustrates a flow diagram of a method to form a build-up interconnect according to one embodiment of the present invention. After operation 202 laminates a first dielectric film onto a core of a build-up structure, operation 204 generates a first metal layer on the first dielectric film (e.g., using a semi-additive process). Operation 206 laminates a second dielectric film on the first dielectric film where the first metal layer is laminated between the first and second dielectric film and where, during laminating the second dielectric film, the second dielectric film has a glass transition temperature lower than the glass transition temperature of the first dielectric film. Operation 208 generates a second metal layer on the second dielectric film and microvias through the second dielectric film to electronically connect at least a portion of the first metal layer and at least a portion of the second metal layer. Operation 210 determines whether this is the topmost level. Operations 206 and 208 can be repeated for multiple levels of interconnect until the topmost level is formed.

Figure 9:
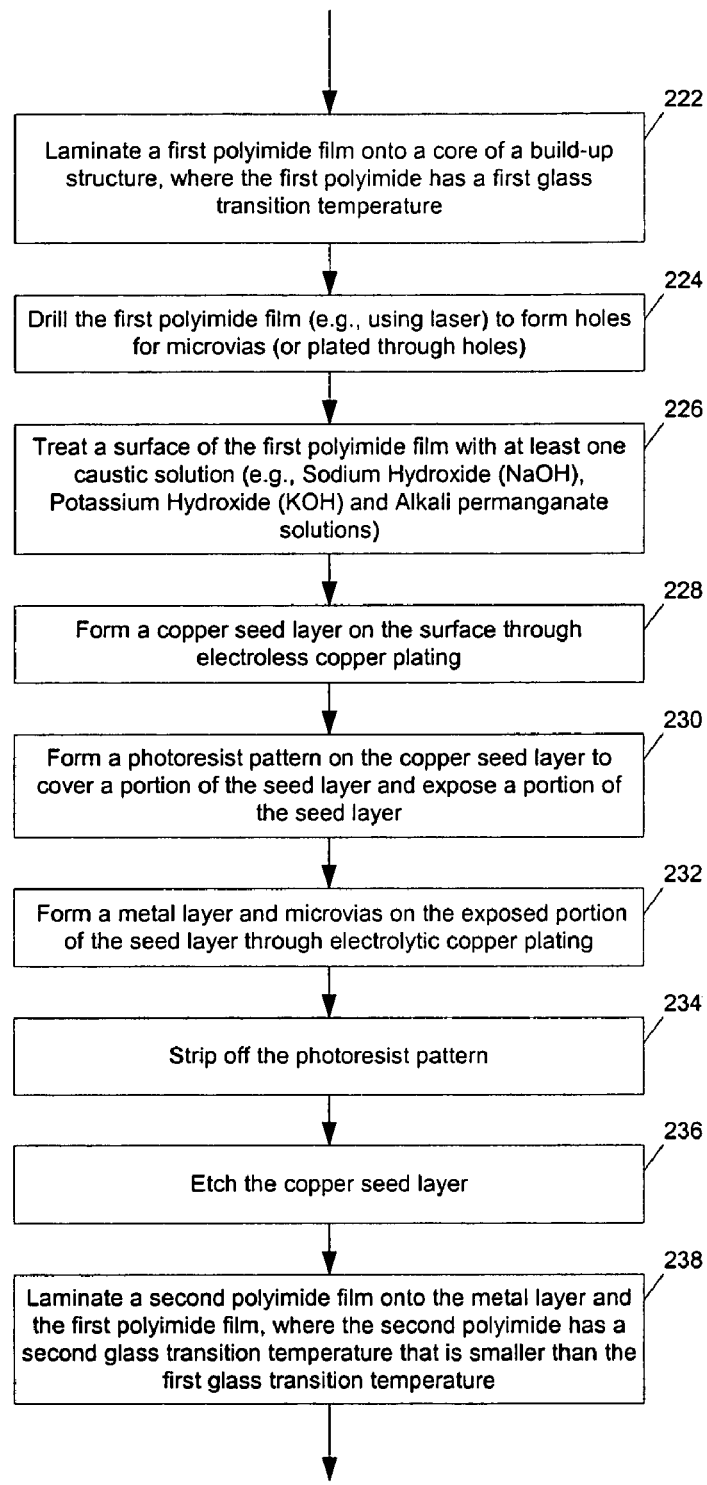
FIG. 9 illustrates a detailed method to form a build-up interconnect according to one embodiment of the present invention.

FIG. 9 illustrates a detailed method to form a build-up interconnect according to one embodiment of the present invention. Operation 222 laminates a first polyimide film onto a core of a build-up structure, where the first polyimide has a first glass transition temperature. Operation 224 drills the first polyimide film (e.g., using laser) to form holes for microvias (or plated through holes). Operation 226 treats a surface of the first polyimide film with at least one caustic solution (e.g., Sodium Hydroxide (NaOH), Potassium Hydroxide (KOH) and Alkali permanganate solutions). Wet chemical surface treatment of polyimide is applied (e.g., using caustic solutions such as KOH and NaOH and alkali permanganate solutions) to improve adhesion of electroless copper to polyimide. This serves as a low cost alternative to vacuum based pre-treatment of metallization processes. Wet chemical surface treatment of polyimide has been demonstrated to give high copper peel strength.

Operation 228 forms a copper seed layer on the surface through electroless copper plating. Operation 230 forms a photoresist pattern on the copper seed layer to cover a portion of the seed layer and expose a portion of the seed layer. Operation 232 forms a metal layer and microvias on the exposed portion of the seed layer through electrolytic copper plating. Operation 234 strips off the photoresist pattern. Operation 236 etches the copper seed layer. Operation 238 laminates a second polyimide film onto the metal layer and the first polyimide film, where the second polyimide has a second glass transition temperature that is smaller than the first glass transition temperature. Operations 224-238 can be repeated to form multiple levels of interconnect.

Figure 10:
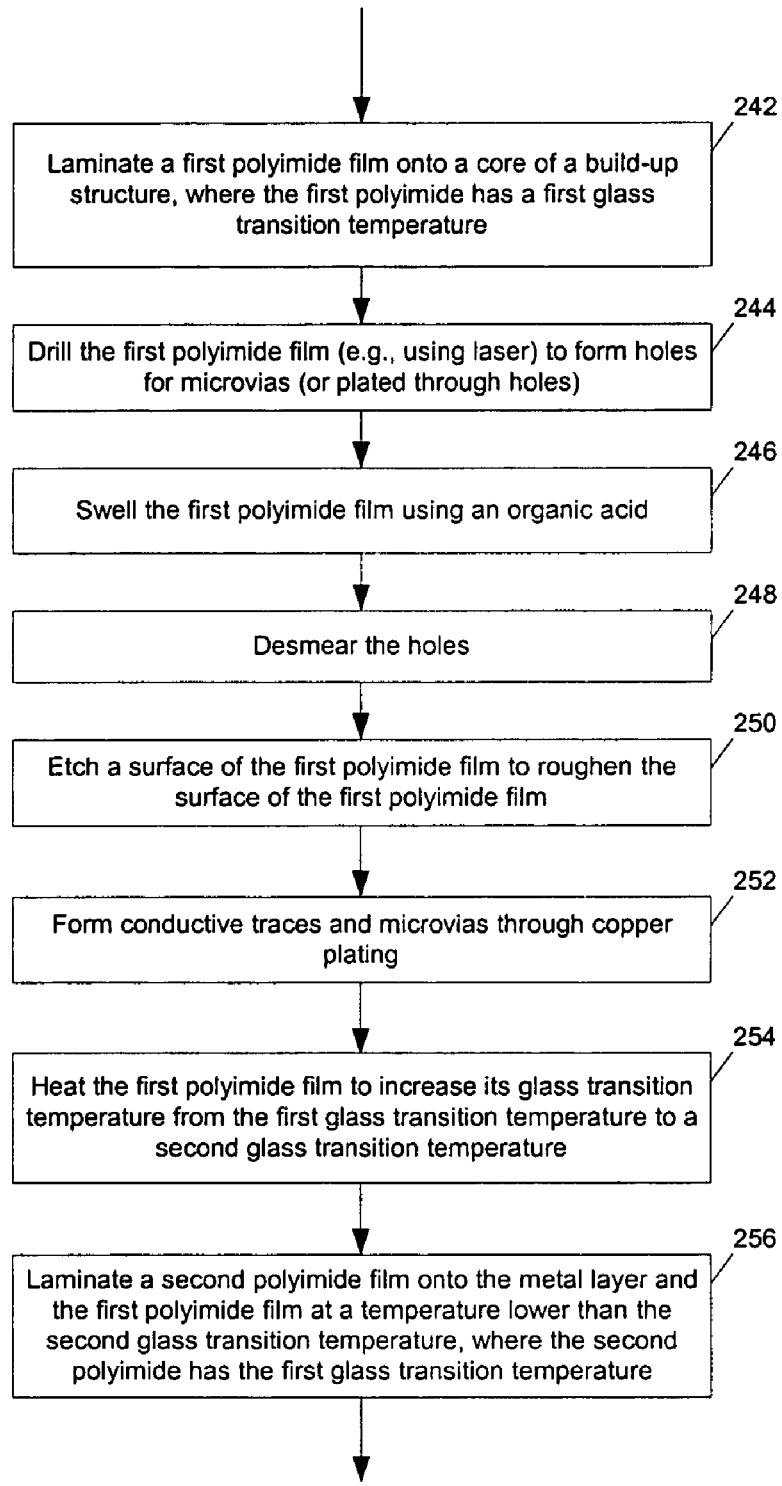
FIG. 10 illustrates another detailed method to form a build-up interconnect according to one embodiment of the present invention.

FIG. 10 illustrates another detailed method to form a build-up interconnect according to one embodiment of the present invention. Operation 242 laminates a first polyimide film onto a core of a build-up structure, where the first polyimide has a first glass transition temperature. Operation 244 drills the first polyimide film (e.g., using laser) to form holes for microvias (or plated through holes). Operation 246 swells the first polyimide film using an organic acid (e.g., alkoxy-ethanol or other alkaline based swellers). Operation 248 desmears the holes. Operation 250 etches a surface of the first polyimide film to roughen the surface of the first polyimide film. Operation 252 forms conductive traces and microvias through copper plating. Operation 254 heats the first polyimide film to increase its glass transition temperature from the first glass transition temperature to a second glass transition temperature. Alternatively curing the first polyimide film through heating (e.g., in an oven) to increase its glass transition temperature can be performed before the conductive traces and microvias are formed through copper plating. Operation 256 laminates a second polyimide film onto the metal layer and the first polyimide film at a temperature lower than the second glass transition temperature, where the second polyimide has the first glass transition temperature. Operations 244-256 can be repeated to form multiple levels of interconnect.

Thus, one embodiment of the present invention provides layered build-up dielectrics with a gradation in glass transition temperature for multilevel interconnections in high density substrates. In one embodiment of the present invention, a multilevel structure is fabricated using layers dielectrics of different glass transition temperatures to form high density interconnection for ultra low-k (e.g., dielectric constant <2) semiconductor devices. Embodiments of the present invention include packages with a low-CTE substrate with a low CTE core material and reliable build up layers, such as polyimides as build up materials on low-CTE core material. The build-up layers of polymers have graded glass transition temperature. One embodiment of the present invention uses a combination of thermosetting and thermoplastic polymers for multi-level build up applications; and the build-up layer materials are high toughness and low CTE dielectrics, such as polyimides. In one embodiment of the present invention, a lamination process is used to apply the polyimide films as the build-up layers. Low cost wet chemical surface treatment of polyimides and wet chemical surface roughening of polyimides are used to improve the adhesion of the polyimide to metal traces which are formed using a low cost semi-additive process. Embodiments of the present invention include methods to form highly reliable multilevel build-up structures and methods to form highly reliable multilevel structures for package, board, interposer and other applications.

One embodiment of the present invention provides a reliable, high performance low CTE, low loss, build-up dielectric material for current and future electronic packages. Low CTE and low modulus dielectric materials can provide improved reliability of microvia build-up packages. The use of low-loss, low dielectric constant, thin dielectrics enables high speed signal routing. Traditionally, lowering the CTE of epoxy-based dielectric materials has been achieved by increasing the silica filler content. This however affects the performance and manufacturability of the resin (e.g., adhesion, laser-via profile, mechanical properties). Traditional polyimide and PTFE (polytetrafluoroethylene) based dielectric materials are typically thermoplastic. The high temperature and high pressure lamination of these dielectrics over an underlying thermoplastic dielectric film can result in a shift of patterns (e.g., the interconnect traces) which could result in performance and reliability issues. Moreover, lamination over wide spaces of copper circuitry results in significant non-planarity. The high cure temperature requirement of most polyimide based materials prevents their use with low temperature organic substrates, leading to the use of expensive high temperature compatible substrates such as metal core and ceramic based substrates. The thermoplastic behavior of traditional polyimides makes it difficult to integrate them with a semi-additive process, requiring high temperature and high pressure lamination equipments. One embodiment of the present invention provides higher performance base resins with intrinsically lower CTE and dielectric loss and better cohesive strength.

One embodiment of the present invention incorporates a thermosetting functionality into the base resin. In one embodiment, norbornene-based endcaps with a catalyst driven Ring Opening Metathesis Polymerization (ROMP) mechanism are used to incorporate a thermosetting functionality into the base resin. The cyclic (ring) structure of these groups provides improved thermal performance; and the hydrocarbon ring saturation provides a lower loss material. The presence of a polyimide base provides the superior mechanical properties, while the endcap-thermosetting functionality improves manufacturability. In one embodiment of the present invention, the glass transition temperature of the film is increased after a post lamination thermal cure (crosslinking) initiated by a latent transition metal catalyst. This allows for both improved rheological performance at lamination as well as adequate stability during multi-layer lamination.

Figure 11:
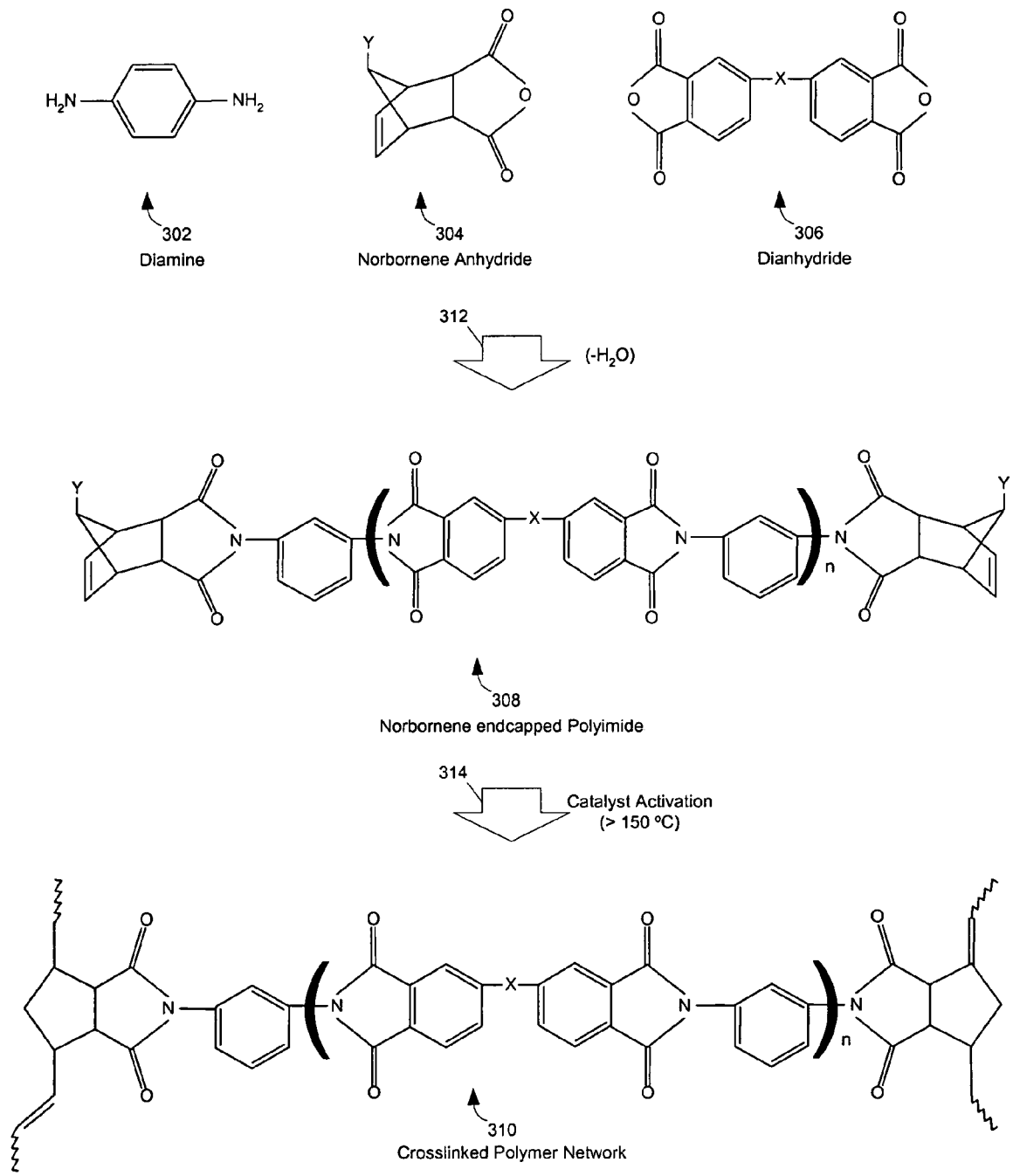
FIG. 11 shows a reaction mechanism for a build-up dielectric material according to one embodiment of the present invention.

One embodiment of the present invention provides a polyimide-based material formulation for a build-up dielectric material with a low dielectric constant, low dielectric loss, low CTE and improved reliability. FIG. 11 shows a reaction mechanism for a build-up dielectric material according to one embodiment of the present invention. In FIG. 11, the general structure of the base material formulations involves the polyimide/polyimide precursors including diamine (e.g., 302), dianhydride (e.g., 306) and norbornene anhydride (e.g., 304). After the imidization (e.g., 312), a norbornene endcapped polyimide (e.g., 308) is generated. After a crosslinking reaction (e.g., 314) under catalyst activation, the polyimide forms a crosslinked polymer network (e.g., 310) with an increased glass transition temperature. In one embodiment of the present invention, the imidization process and the crosslinking reaction are separate from each other. The imidization process generates a norbornene endcapped polyimide film suitable for lamination at a low temperature (e.g., less than 120° C.) and a low pressure (e.g., lower than 2.5 MPa). Thus, the lamination process does not cause pattern shifting in the underlying layers. The crosslinking reaction (e.g., 314) is activated after the lamination of the film of the norbornene endcapped polyimide. After the crosslinking reaction, the mechanical strength and the glass transition temperature of the film is increased so that the lamination of a subsequent film does not cause a pattern shift in the dielectric layers.

In one embodiment of the present invention, n in FIG. 11 is chosen so as to balance viscosity and film forming properties. The base anhydride and amine of the polyimide precursor are chosen to balance the requirement for CTE and flexibility and can be chosen from a group including and not limited to: X=PMDA (pyromellitic dianhydride), BPDA (biphenyl tetracarboxylic dianhydride), BTDA (benzophenone tetracarboxylic dianhydride), DSDA (diphenylsulfonetetracarboxylic dianhydride), BPADA (bisphenol A dianhydride) and 6FOA (hexafluoropropane dianhydride). The diamine can be chosen from a group including and not limited to: m-PDA (metaphenylene diamine), ODA (oxydianiline), p-PDA (p-phenylenediamine monomer), DDS (sulfonyldianiline), and MOA (methylene dianiline). The norbornene endcap precursor can be a nadic anhydride and any of the associated derivatives where Y is chosen to control the ring strain and end film properties and Y can be chosen from a group including and not limited to: oxygen, sulphonyl, carbonyl, carboxyl, oxycarbonyl, and amine moieties.

In one embodiment, imidization (312) is achieved by solution or chemical route with solvents that can be chosen from a group including and not limited to: NMP(n-methyl-2-pyrrolidone), GBL(gamma-butyrolactone), DMAC(dimethyl acetamide), DMS(dynamic mechanical spectroscopy), DMSO(dimethyl sulfoxide), THF(tetrahydrofuran), cyclohexane, toluene, anisole, pyridine, quinoline etc. Two or more of these solvents can be used to: 1) limit the boiling point of the mixture; and, 2) abstract the water released from cyclodehydration reaction. In one embodiment of the present invention, a co-solvent system includes DMAC (dimethyl acetamide) and cyclohexane with toluene. In one embodiment of the present invention, the dielectric material formulation further includes fillers, stabilizers, catalysts, film forming agents, viscosity modifiers and flame retardants. For example, one embodiment includes the use of nano-silica coated with compatible reactive epoxy-silane based adhesion promoters to reduce the CTE of the polyimide based dielectric; one embodiment further includes the use of vinyl and epoxy terminated alkoxy-silane coupling agents as part of the base resin formulation for enhanced adhesion.

Figure 12:
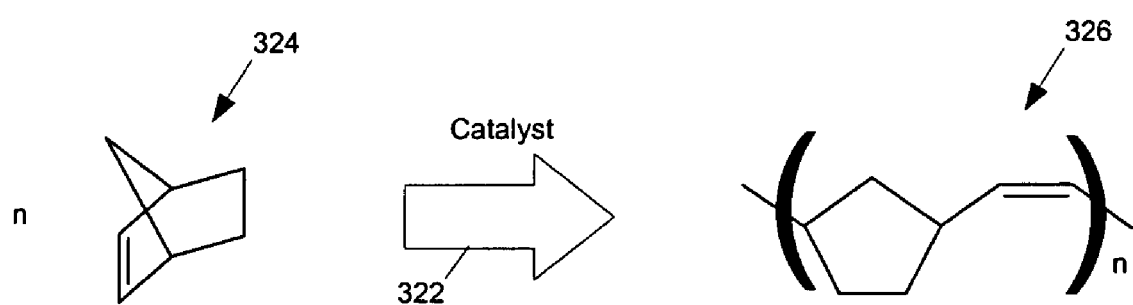
FIG. 12 shows a ring opening and crosslinking mechanism to form a build-up interconnect structure according to one embodiment of the present invention.

In one embodiment of the present invention, latent catalysts are included in the base resin formulation to promote the crosslinking reaction post lamination/coating of the imide. The melt viscosity and the glass transition temperature of the polyimide film is low enough to enable lamination at low temperatures (e.g., less than 150° C.) and low pressures (e.g., less than 2 MPa). The low temperature and low pressures avoid premature crosslinking. Crosslinking of the resin formulation in one embodiment of the present invention is achieved by a ROMP (Ring Opening Metathesis Polymerization) mechanism, illustrated in FIG. 12. Promoted by a catalyst, the crosslinking reaction (e.g., 322) opens a number of rings (e.g., 324) of the norbornene endcaps to form a crosslinked structure (e.g., 326) which crosslinks the norbornene endcapped polyimide (e.g., 308 of FIG. 11) to form a crosslinked polymer network (e.g., 310 of FIG. 11)

Figure 13:
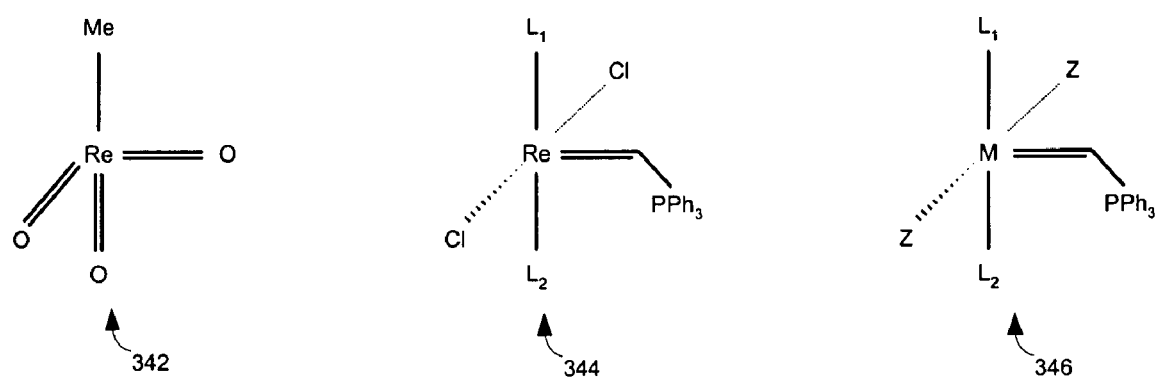
FIG. 13 shows examples of catalysts which can be used to promote the ring opening and crosslinking illustrated in FIG. 12.

Typical Grubbs catalysts (e.g., 342, 344 and 346) used to promote the crosslinking reaction are shown in FIG. 13. These are functionalized transition metal carbenes with M=Re (Rhenium), Rh (Rhodium), Mo (Molybdenum), W (Tungsten), Ti (Titanium), Co (Cobalt), Lr (Lawrencium), Zr (Zirconium), Ni (Nickel), Pd (Lead), etc. Extremely active, some of the Grubbs catalysts, for example methyltrioxorhenium $Re(Me)O_3$ (342), promote polymerization in minutes even at room temperature.

In one embodiment of the present invention, the latent catalysis is achieved by using functionalized ligand-bound Grubbs catalysts that get activated only at high temperatures (e.g., greater than 150° C.). In one embodiment of the present invention, the temperature to activate the crosslinking reaction in between 150° C. and 180° C.; and the temperature for lamination is less than 150° C.

In one embodiment of the present invention, the catalysis is achieved by using a catalyst microencapuslation technique, in which the reactive $Re(Me)O_3$ catalyst or the functionalized latent Grubbs catalysts are embedded in an inert base resin and encapsulated with a urea-formaldehyde or polycarbonate overcoat. In one embodiment, functionalized polycarbonates, such as polyethylene and polypropylene carbonates, are used as the encapsulant. Similar to the urea-formaldehyde capsules, the encapsulant resins degrade or disintegrate at high temperatures (e.g., greater than 150° C.) to liberate the embedded Grubbs catalyst which activates the crosslinking reaction. For the sacrificial overcoat, the decomposition temperature and the glass transition temperature of polycarbonates can be modulated by the chemical structure and with the incorporation of appropriate photoactive reagents. Thus, the degradation of such polycarbonates can be achieved either through a photo-chemical mechanism or a thermal mechanism or a combination, leaving minimal to zero residue after the degradation. The ring opening and crosslinking reaction increases the glass transition temperature and the mechanical strength of the polyimide base material. In addition, a concomitant toughening mechanism can also be incorporated in the base resin. In a further embodiment of the present invention, a combination of the encapsulated catalysts and non-encapsulated catalysts are used.

Figure 14:
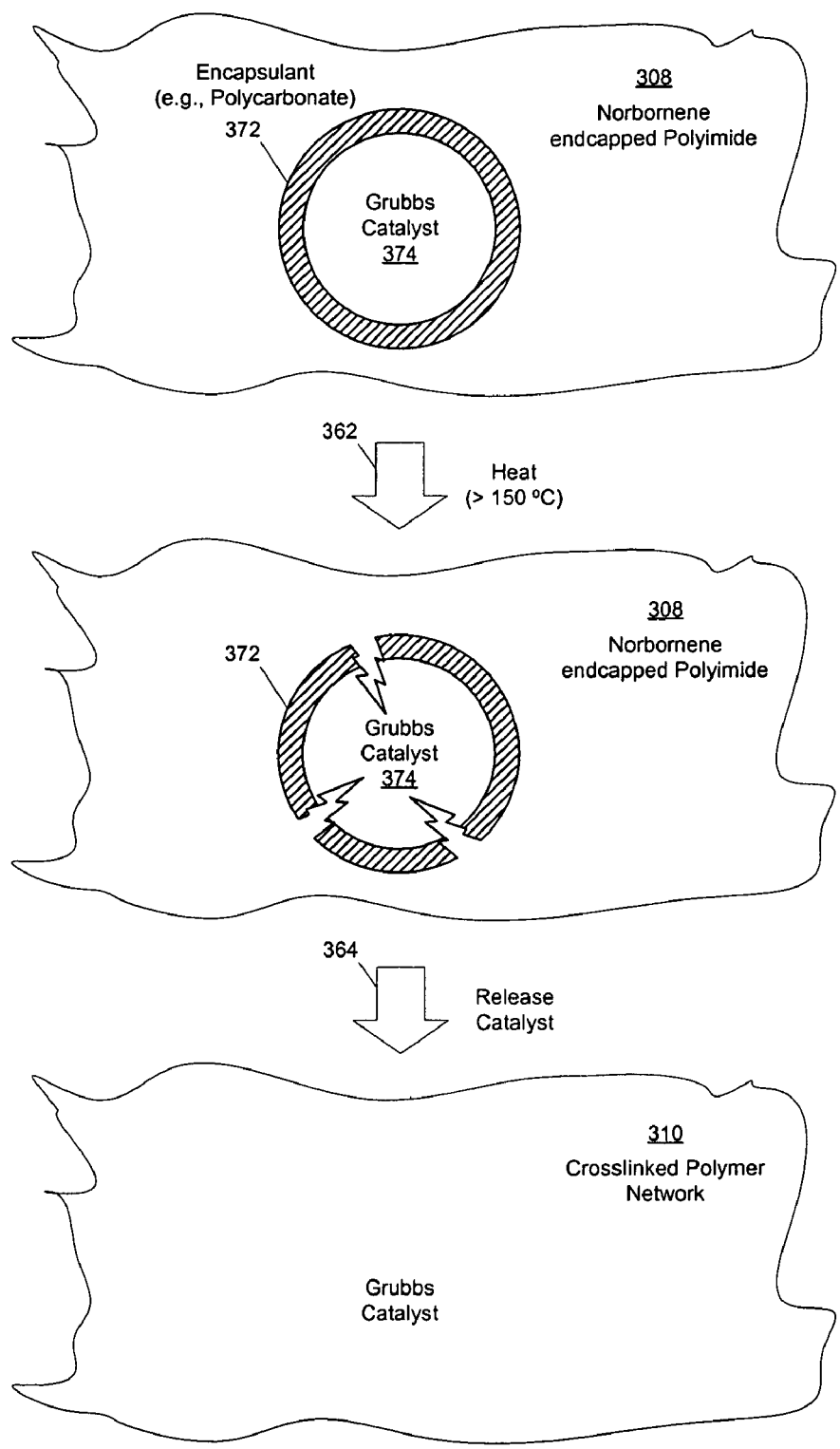
FIG. 14 shows a curing process according to one embodiment of the present invention.

FIG. 14 shows a curing process according to one embodiment of the present invention. In FIG. 14, a norbornene endcapped polyimide (e.g., 308) has a low glass transition temperature suitable for a lamination process. A Grubbs catalyst (e.g., 374) is encapsulated in an encapsulant (e.g., 372), such as a polycarbonate. The encapsulant is capable to encapsulated the Grubbs catalyst from the norbornene endcapped polyimide during the lamination process (e.g., at a temperature lower than 100° C. and at a pressure lower than 2 MPa). In one embodiment of the present invention, the curing is performed after the lamination process to increase the glass transition temperature and the mechanical strength of the film. After the material is heated (e.g., 362) to a degradation temperate (e.g., >150° C.) of the encapsulant (372), the degradation of the encapsulant and the releasing of the catalyst begin. After the releasing of the catalyst (e.g., 364), the crosslinking reaction is activated to form a crosslinked polymer network (310) in the film, which increases the glass transition temperature and the mechanical strength of the film.

Figure 15:
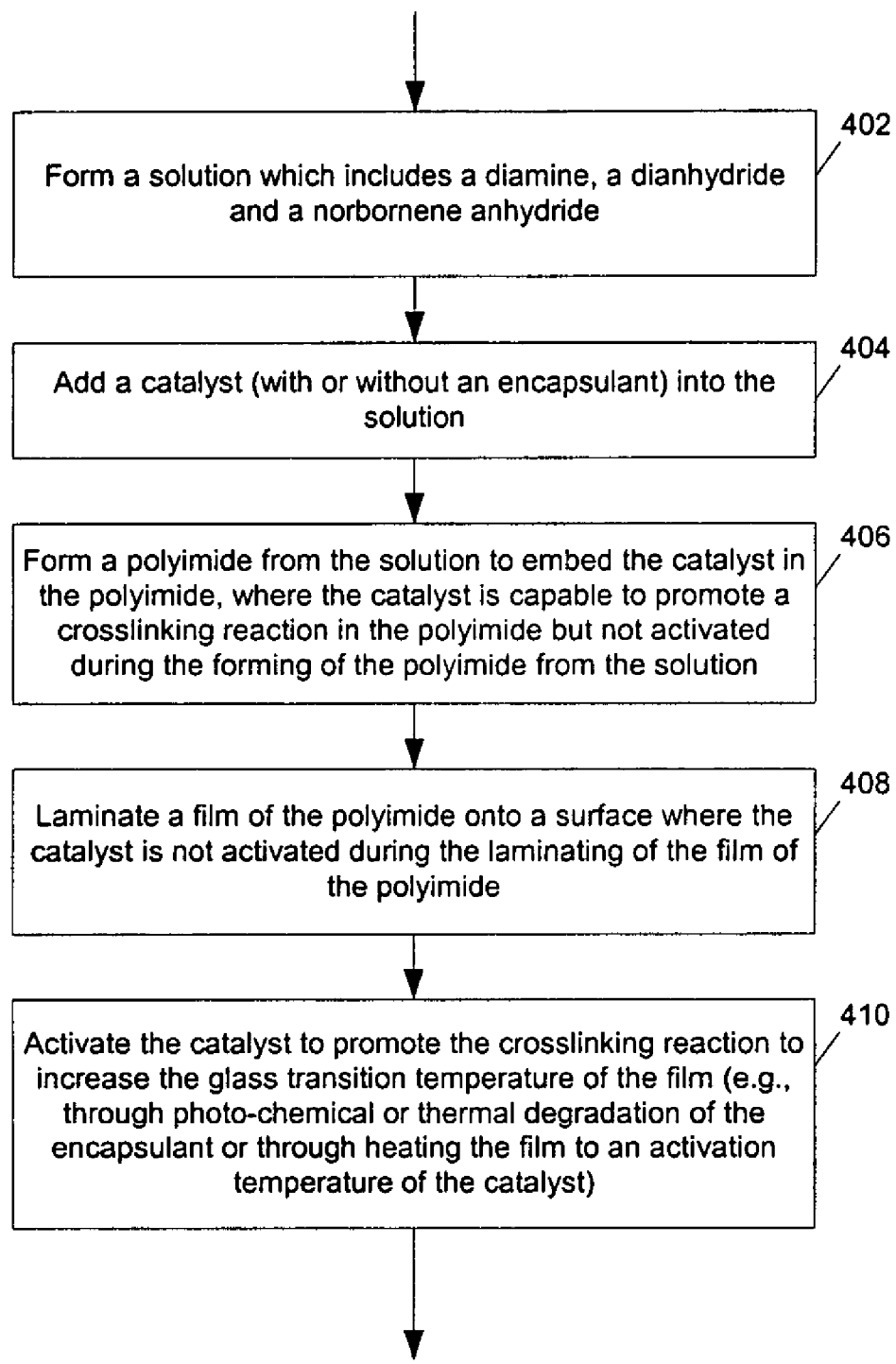
FIG. 15 shows one process to generate and use a polyimide film according to one embodiment of the present invention.

FIG. 15 shows one process to generate and use a polyimide film according to one embodiment of the present invention. Operation 402 forms a solution which includes a diamine, a dianhydride and a norbornene anhydride. Operation 404 adds a catalyst (with or without an encapsulant) into the solution. The catalyst is encapsulated if the catalyst is active under the condition for imidization or lamination. Operation 406 forms a polyimide from the solution to embed the catalyst in the polyimide, where the catalyst is capable to promote a crosslinking reaction in the polyimide but not activated during the forming of the polyimide from the solution. Operation 406 laminates a film of the polyimide onto a surface where the catalyst is not activated during the laminating of the film of the polyimide. Operation 410 activates the catalyst to promote the crosslinking reaction to increase the glass transition temperature of the film (e.g., through photo-chemical or thermal degradation of the encapsulant or through heating the film to an activation temperature of the catalyst).

Figure 16:
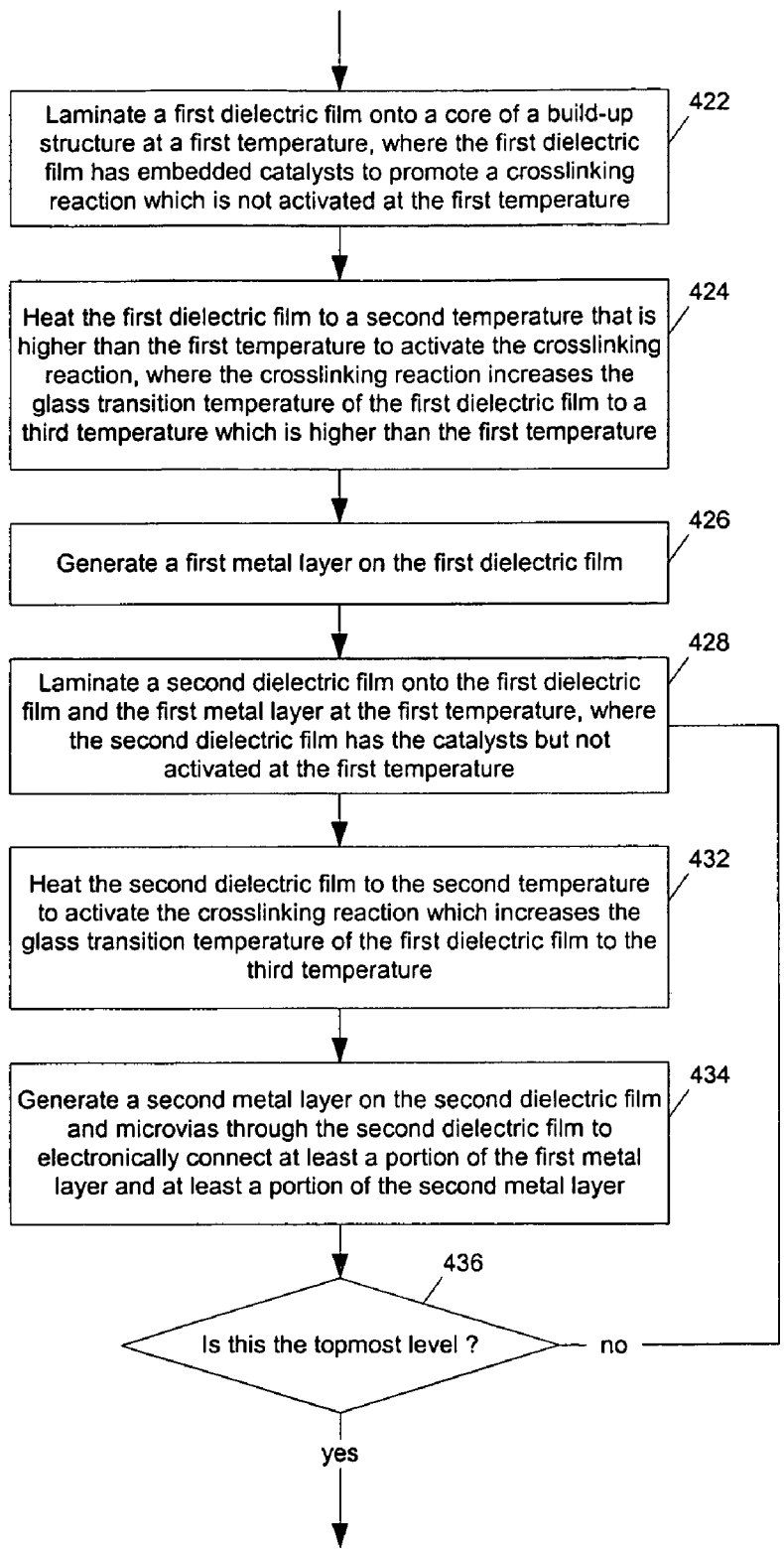
FIG. 16 shows a detailed method to form a build-up interconnect according to one embodiment of the present invention.

FIG. 16 shows a detailed method to form a build-up interconnect according to one embodiment of the present invention. Operation 422 laminates a first dielectric film onto a core of a build-up structure at a first temperature, where the first dielectric film has embedded catalysts to promote a crosslinking reaction which is not activated at the first temperature. Operation 424 heats the first dielectric film to a second temperature that is higher than the first temperature to activate the crosslinking reaction, where the crosslinking reaction increases the glass transition temperature of the first dielectric film to a third temperature which is higher than the first temperature. Operation 426 generates a first metal layer on the first dielectric film. Alternatively, the heating of the first dielectric film can be performed after the forming of the first metal layer. Operation 428 laminates a second dielectric film onto the first dielectric film and the first metal layer at the first temperature, where the second dielectric film has the catalysts but not activated at the first temperature. Operation 432 heats the second dielectric film to the second temperature to activate the crosslinking reaction which increases the glass transition temperature of the first dielectric film to the third temperature. Operation 434 generates a second metal layer on the second dielectric film and microvias through the second dielectric film to electronically connect at least a portion of the first metal layer and at least a portion of the second metal layer. Operation 436 determines whether this is the topmost level. Operations 428-434 can be repeated until the topmost level is formed.

Thus, one embodiment of the present invention provides a low temperature, low CTE polyimide-based dielectric material functionalized to meet build-up dielectric requirements in current and future semiconductor packages, which is compatible with current package constructions and high volume manufacturing (HVM) processes and infrastructure. One embodiment of the present invention includes a low CTE reliable build-up dielectric (e.g., norbornene-based capping of polyimides), which is a low-dielectric loss, low dielectric constant, low CTE, reliable build-up dielectric material. One embodiment of the present invention uses a combination of thermosetting and thermoplastic functionalities on polymers for multi-level build up applications. One embodiment of the present invention uses low temperature catalyst activation of norbornene capped polyimide build-up dielectrics to increase the mechanical strength and glass transition temperature of the film after the lamination process. One embodiment of the present invention further uses nano-silica fillers to reduce the CTE of polyimide based materials and adhesion enhancing moieties as part of the resin formulation to from a high toughness and uses low CTE dielectrics as build-up layer material. The use of norbornene capping of polyimides provides a means of introducing thermosetting functionality into the base resin which makes it easier to integrate with a build-up process. The use of transition metal based catalysts for low temperature activation of cure-reaction provides for the use of polyimide based materials on organic substrates. The use of nano-silica fillers results in a reduction of the CTE of the polyimide based dielectric material. Incorporation of silane coupling agents results in improved adhesion to metals and dielectrics. Embodiments of the present invention provide a reliable and scalable multi-layering/build-up technology for substrate, board or interposer applications and a substrate package technology which can be manufactured using existing supplier HVM infrastructure. In one embodiment of the present invention, a lamination process of such a material is used to apply polyimides as build-up layers; a low cost semi-additive process is used to form conductive layers on the polyimide-based dielectric layers. Embodiments of the present invention includes methods to form highly reliable multilevel build-up structure and methods to form highly reliable multilevel structure for package, board, interposer and other applications. One embodiment of the present invention includes semiconductor devices with packages/substrates using this build-up dielectric material.

One embodiment of the present invention provides a low cost method to improve solder resist reliability. A substrate according to one embodiment of the present invention has improved solder resist assembly and preconditioning reliability.

One embodiment of the present invention includes a highly reliable, high performance, low dielectric loss, and low dielectric constant solder resist for electronic packages with lead free compatibility. Solder resist cracking/delamination after lead free preconditioning is a concern that needs to be addressed to enable lead-free compatible packages. The transition to copper lead free first level interconnect on the die and the requirement for lead free (260° C.) preconditioning may cause solder resist cracking and/or delamination. The lack of wettability on the solder resist surface leaves a gap between the solder resist and the solder after reflow such that underfill and its silica filler are deposited into the solder resist opening during assembly. The CTE mismatch in the underfill and solder resist leads to solder resist cracking. This problem is even more pronounced for no-flow underfill applications.

One embodiment of the present invention enables lead free compatible packaging for current and future semiconductor devices through the elimination of gap between solder resist opening and solder to limit underfill incorporation and improves reliability. One embodiment of the present invention provides a reliable and scaleable technology for rigid and flexible substrate, board or interposer applications and a substrate package technology which can be manufactured using existing supplier high volume manufacturing (HVM) infrastructure.

One embodiment of the present invention uses a polyimide-based material formulation for solder masking applications with a low dielectric constant, low dielectric loss, low CTE and improved reliability and a low cost metal seeding method to coat the sidewalls of the solder resist. In one embodiment of the present invention, ultraviolet (UV) laser assisted palladium seeding on selective areas of the solder resist and electroless copper plating are used to provide a wettable surface for solder during reflow, which eliminates the gap between sidewalls of the solder resist opening and solder. This process is especially advantageous for no-flow underfill (NUF) applications. The UV source required to achieve the selective seeding may be from laser or photo-lithography/exposure tools or their modifications. Functionalized polyimide based solder resists are particularly amenable to this methodology. Some organometallic seed layer solutions, such as palladium-amine complexes, have the properties of excellent seeding characteristics upon laser irradiation, uniformity and selectivity of radiation, which are suitable for this methodology.

Figure 17:
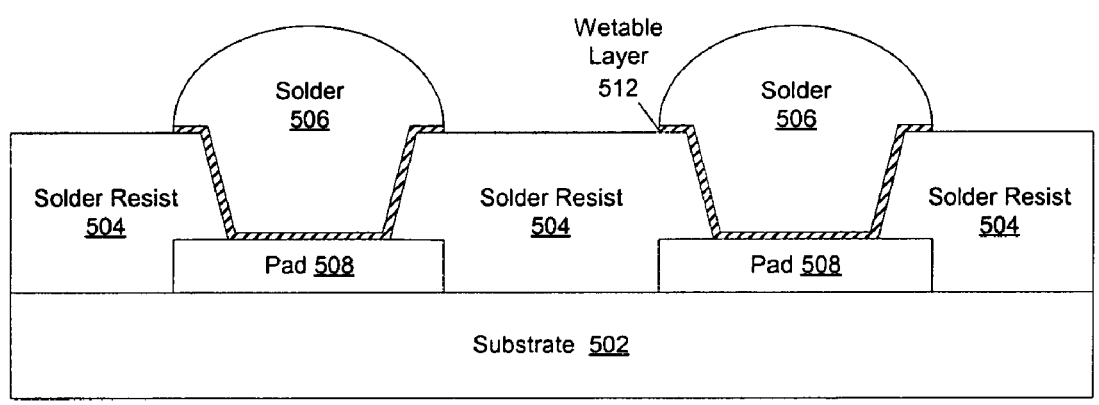
FIG. 17 illustrates a solder resist layer of a build-up interconnect according to one embodiment of the present invention.

FIG. 17 illustrates a solder resist layer of a build-up interconnect according to one embodiment of the present invention. In FIG. 17, the solder resist (e.g., 504) has a wettable layer (512) formed on and near the solder resist opening sidewall so that the solder (e.g., 506) can reliably bond to the solder resist opening sidewall. Since the solder fully fills the solder resist opening, no underfill material can enter the solder resist opening. Thus, the solder can reliably bond to the pads (e.g., 508) of the substrate (e.g., 502). The pads (e.g., copper contacts) of the substrate connect to the conductive interconnects in the substrate, which can be a build-up interconnect structure as described above. In one embodiment, the substrate includes a build-up interconnect structure where the later applied dielectric layers are laminated at temperatures lower than the glass transition temperature of the earlier laminated dielectric layers (e.g., a build-up structure with a layered glass transition temperature structure and/or built using a thermosetting film of a norbornene endcapped polyimide with embedded Grubbs catalysts).

Figure 18:
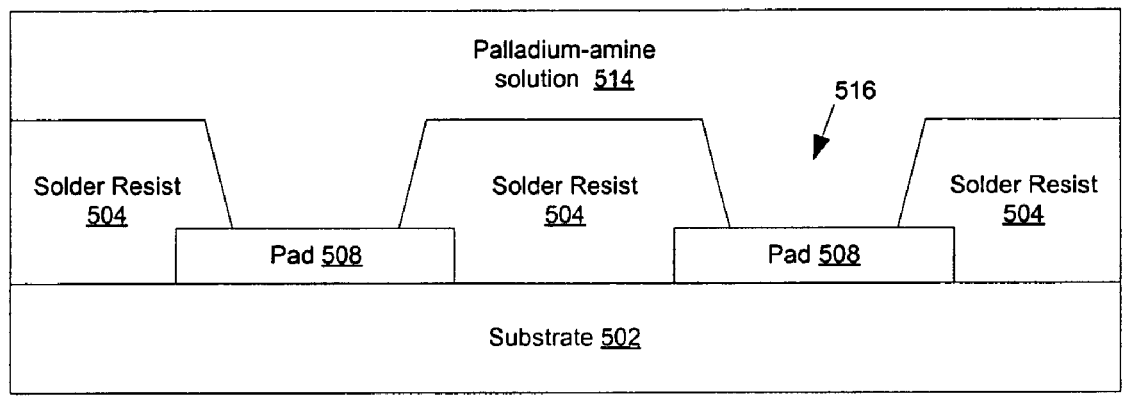
FIGS. 18-21 illustrate a process to form a microelectronic device with a solder resist layer of a build-up interconnect according to one embodiment of the present invention.
Figure 19:
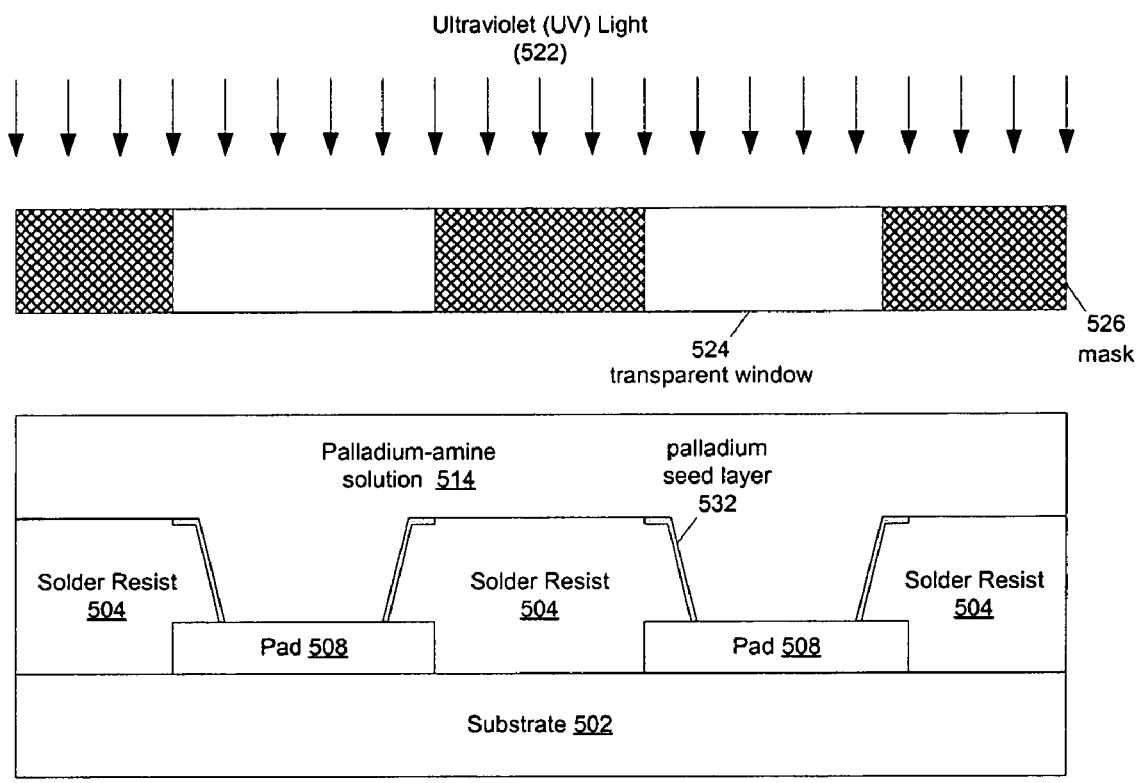
Figure 20:
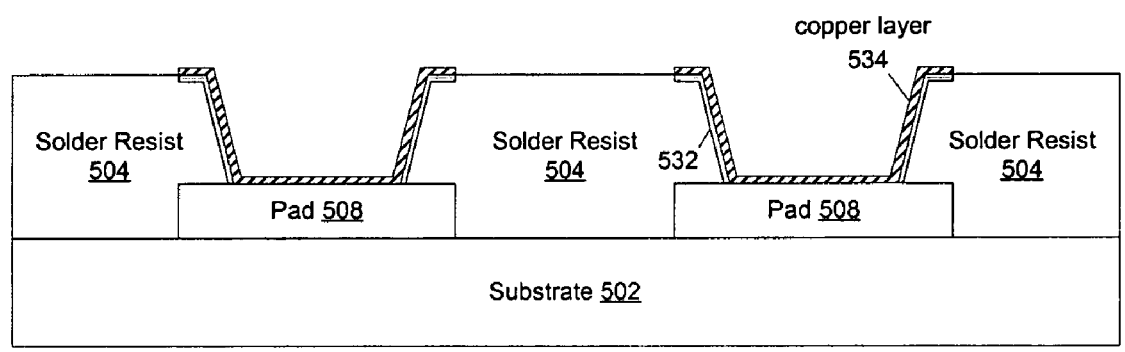
Figure 21:
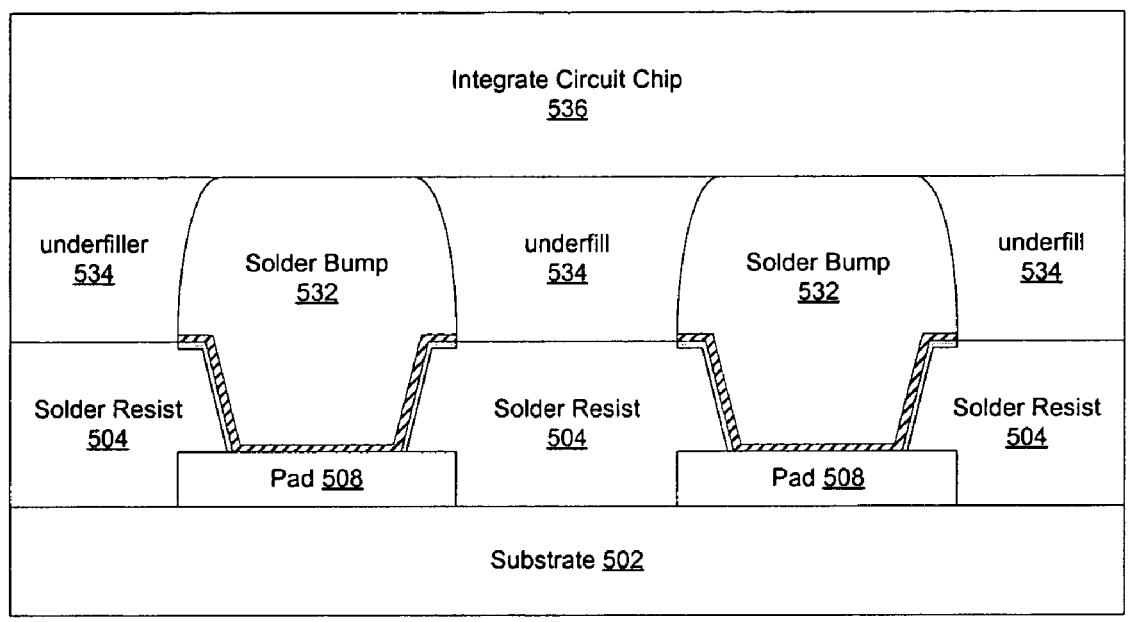

FIGS. 18-21 illustrate a process to form a microelectronic device with a solder resist layer of a build-up interconnect according to one embodiment of the present invention. In FIG. 18, the solder resist opening (e.g., 516) is filled with a solution with palladium content, such as a palladium-amine solution (e.g., 514). For example, any precursor that can generate (Pd(NH3)4]2+) moieties can be used to form a palladium-amine solution. Other solutions that can form a photo-chemical deposition of a seed layer of metal on the polyimide solder resist opening upon selective laser irradiation also be used. In one embodiment of the present, the sidewall of the solder resisting opening forms an acute angle with respect to the substrate so that the sidewall can receive the light coming substantially perpendicular to the substrate. In FIG. 19, a mask (e.g., 526) is used to selectively shine an ultraviolet (UV) light (e.g., 522) on the sidewalls of the solder resist openings. In one embodiment of the present invention, an ultraviolet (UV) laser is used. The ultraviolet (UV) light assists the palladium seeding on the sidewalls of the solder resist openings. In one embodiment of the present invention, the palladium seeding layer (e.g., 532) extends from the sidewall to the nearby portion of the surface of the solder resist layer that is parallel to the solder resist layer. FIG. 20 shows the copper layer (e.g., 534) plated over the palladium seeding layer (e.g., 532). In one embodiment of the present invention, the copper layer is generated through electroless copper plating. FIG. 21 shows solder bumps (e.g., 532) reliably connecting the substrate (e.g., 502) to the integrated circuit chip (e.g., 536). Since the solder bumps bond to the solder resist opening sidewall plated with copper, the underfill (e.g., 534) cannot enter the solder resist opening.

Figure 22:
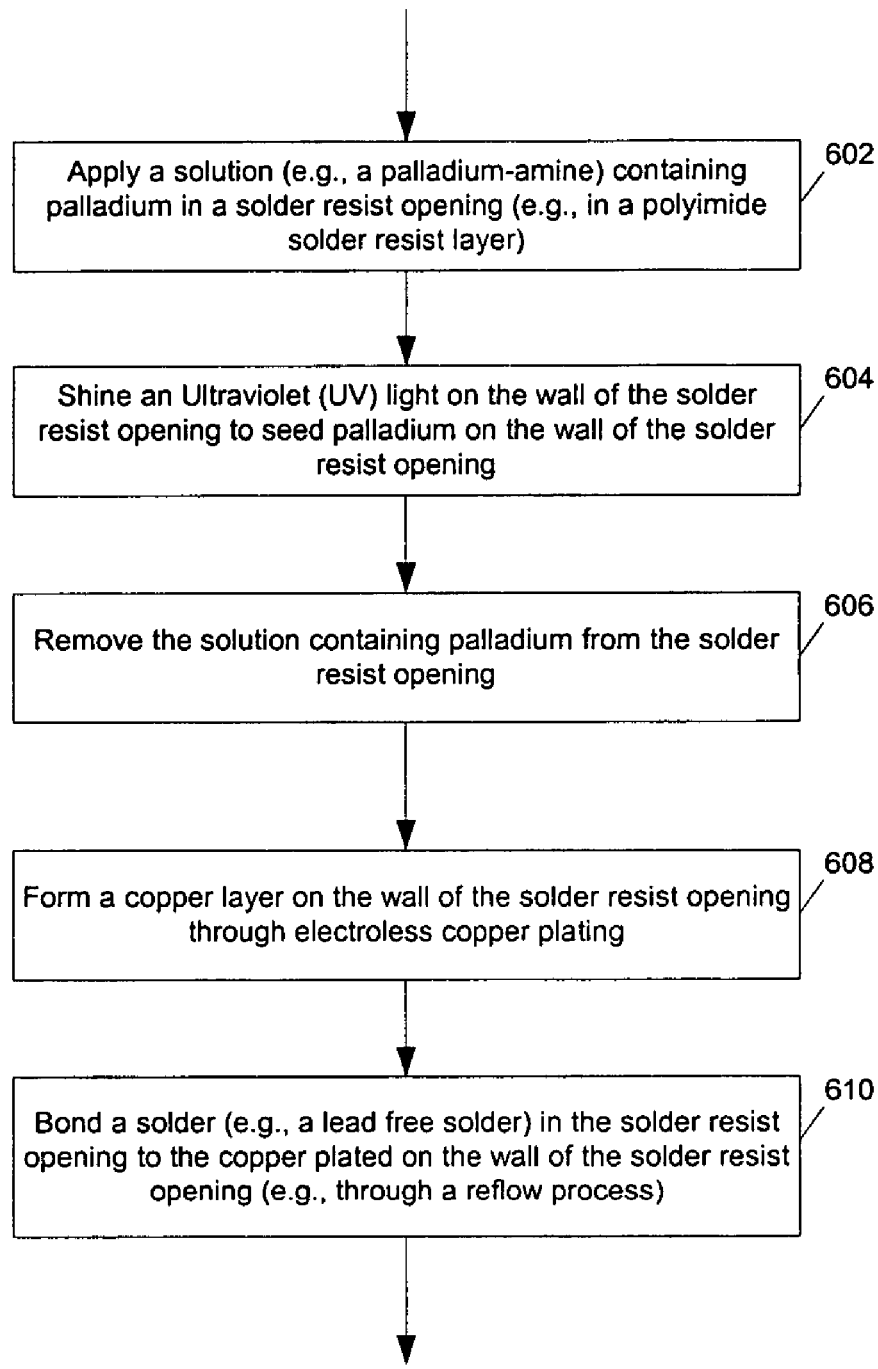
FIG. 22 illustrates a method to make solder connection according to one embodiment of the present invention.

FIG. 22 illustrates a method to make solder connection according to one embodiment of the present invention. Operation 602 applies a solution (e.g., a palladium-amine) containing palladium in a solder resist opening (e.g., in a polyimide solder resist layer). Operation 604 shines an Ultraviolet (UV) light on the wall of the solder resist opening to seed palladium on the wall of the solder resist opening. Operation 606 removes the solution containing palladium from the solder resist opening. Operation 608 forms a copper layer on the wall of the solder resist opening through electroless copper plating. Operation 610 bonds a solder (e.g., a lead free solder, such as SnAg) in the solder resist opening to the copper plated on the wall of the solder resist opening (e.g., through a reflow process).

Thus, in one embodiment of the present invention, a low CTE solder resist material includes a polyimide, such as a polyimide with norbornene-based capping. The solder resist layer has low-dielectric loss, low dielectric constant and low CTE. The solder resist opening walls are metallized through a low cost process of laser assisted deposition of seed metal (e.g., palladium) for electroless plating. The wettable layer eliminates underfill concentration in solder resist openings. In one embodiment of the present invention, the solder resist material is laminated at a temperature lower than the glass transition temperature of the underlying dielectric layers to avoid pattern shifting during the lamination process. In one embodiment of the present invention, the solder resist material is cured through the activation of the catalysts embedded in the material. The substrate can be a multilevel build-up structure on a rigid or flexible core or a multilevel build-up coreless structure. One embodiment of the present invention includes packages with rigid and flexible substrates using such polyimide based solder resist and semiconductor devices with packages/substrates using such solder resist.

In the foregoing specification, specific exemplary embodiments have been described. It will be evident that various modifications may be made thereto without departing from the broader spirit and scope of the disclosure. The specification and drawings are, accordingly, to be regarded in an illustrative sense rather than a restrictive sense.

What is claimed is:

1. A method, comprising:
   laminating a first dielectric film on a surface;
   forming conductive traces on the first dielectric film; and
   laminating a second dielectric film on the laminated first dielectric film at a lamination temperature, the conductive traces being laminated between the first and second dielectric films;
   wherein, during the laminating of the second dielectric film, the laminated first dielectric film has a first glass transition temperature; and the first glass transition temperature is higher than the lamination temperature of the second dielectric film, wherein the first dielectric film comprises a first polyimide; the second dielectric film comprises a second polyimide; during the laminating of the second dielectric film, the second dielectric film has a second glass transition temperature; and the second glass transition temperature is lower than the transition temperature.

2. The method of claim 1, wherein the first and second dielectric films are thermoplastic.

3. The method of claim 1, wherein the first dielectric film is thermosetting; and the method further comprises:
   heating the first dielectric film after the laminating of the first dielectric film and before the laminating of the second dielectric film, the first dielectric film having the second glass transition temperature before the heating of the first dielectric film.

4. The method of claim 3, wherein the first dielectric film is laminated over at least one dielectric layer and at least one metal layer.

5. The method of claim 1, further comprising:
   curing the second dielectric film after the laminating of the second dielectric film, the second dielectric film having a second glass transition temperature before the curing of the second dielectric film, the second dielectric film having a third glass transition temperature after the curing of the second dielectric film, the third glass transition temperature being higher than the second glass transition temperature.

6. The method of claim 5, wherein the third glass transition temperature is substantially equal to the first glass transition temperature.

7. The method of claim 6, further comprising:
   laser drilling the second dielectric film to form holes for microvias;
   forming conductive traces on the second dielectric film and microvias to connect the conductive traces on the second dielectric film to the conductive traces on the first dielectric film;
   laminating a third dielectric film on the second dielectric film at a temperature lower than the third glass transition temperature.

8. The method of claim 7, wherein the second dielectric film comprises a polyimide; the method further comprises:
   wet chemical treating a surface of the second dielectric film to promote adhesion of the conductive traces to the polyimide.

9. The method of claim 7, further comprising:
   swelling the second dielectric film using an organic acid; and
   etching a surface of the second dielectric film to roughen the surface of the second dielectric film and desmear the holes.

10. The method of claim 7, wherein the forming of the conductive traces on the second dielectric film comprises:
    forming a seed layer on the second dielectric film through electroless copper plating;
    forming a photoresist pattern over the seed layer;
    depositing copper over a portion of the seed layer not covered by the photoresist pattern through electrolytic copper plating;
    stripping off the photoresist pattern; and
    etching the seed layer.

11. A method, comprising:
    laminating a first film of a material on a surface at a laminating temperature, the material comprising polyimide, and a catalyst embedded in the polyimide, the catalyst being capable of being activated to promote a crosslinking reaction in the polyimide; and
    activating the catalyst to promote the crosslinking reaction in the polyimide after laminating the first film.

12. The method of claim 11, wherein the first film has a first glass transition temperature before activating the catalyst; and the first film has a second glass transition temperature after activating the catalyst; the second glass transition temperature is higher than the first glass transition temperature.

13. The method of claim 12, further comprising:
    forming conductive interconnects on the first film; and laminating a second film of the material on the first film after activating the catalyst, the conductive interconnects being laminated between the first and second films.

14. The method of claim 11, wherein activating the catalyst comprises:
heating the first film to an activation temperature higher than the laminating temperature.

15. The method of claim 14, wherein the catalyst is encapsulated in a sacrificial material which degrades under the activation temperature to release the catalyst.

16. The method of claim 14, wherein the catalyst is not active at a temperature lower than the activation temperature.

* * * * *